(12) United States Patent
Wells (10) Patent No.: US 6,606,246 B2
(45) Date of Patent: Aug. 12, 2003

(54) METHOD AND APPARATUS FOR RETAINING COOLING APPARATUS AND BUS BAR

(75) Inventor: Kevin E. Wells, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/963,940

(22) Filed: Sep. 21, 2001

(65) Prior Publication Data

US 2003/0058621 A1 Mar. 27, 2003

(51) Int. Cl.$^7$ ................................................. H05K 7/20
(52) U.S. Cl. ........................ 361/719; 361/704; 361/707; 361/709; 257/706; 257/718; 257/722; 174/16.3; 165/80.2; 165/80.3; 165/185
(58) Field of Search ................................. 361/695, 703, 361/704, 707, 713–720, 722, 723; 257/706, 718, 719, 722, 727; 174/16.2; 165/80.3, 185

(56) References Cited

U.S. PATENT DOCUMENTS

| | | | | |
|---|---|---|---|---|
| 5,287,249 A | * | 2/1994 | Chen | 165/185 |
| 5,426,405 A | * | 6/1995 | Miller et al. | 257/726 |
| 5,541,811 A | * | 7/1996 | Henningsson et al. | 165/185 |
| 5,579,206 A | * | 11/1996 | McLellan et al. | 174/260 |
| 5,838,064 A | * | 11/1998 | Shimada et al. | 257/706 |
| 5,870,285 A | * | 2/1999 | Kosteva et al. | 165/185 |
| 5,953,208 A | * | 9/1999 | Katsui | 257/719 |
| 6,346,672 B1 | * | 2/2002 | Horng | 174/35 R |
| 6,375,476 B1 | * | 4/2002 | Goodwin et al. | 439/71 |
| 6,419,008 B1 | * | 7/2002 | Wu | 165/80.3 |

* cited by examiner

Primary Examiner—Boris Chervinsky
(74) Attorney, Agent, or Firm—Blakely, Sokoloff, Taylor & Zafman LLP (57) ABSTRACT

A method and apparatus for retaining a cooling apparatus in engagement with an integrated circuit including a frame with a bus bar carrying an electrical signal from one part of a circuitboard to which the frame and the integrated circuit are attached to another part the circuitboard.

29 Claims, 6 Drawing Sheets

METHOD AND APPARATUS FOR RETAINING COOLING APPARATUS AND BUS BAR

FIELD OF THE INVENTION

The present invention is related to hardware used to retain heatsinks, fans or other thermal control hardware in a position adjacent to an integrated circuit.

ART BACKGROUND

It has become commonplace for integrated circuits, particularly those used to comprise commonly available computer systems, to require the installation of specialized hardware for cooling, such as heatsinks, fans, thermoelectric cooler (TEC) modules, etc. As a result, numerous forms of hardware have been devised to maintain such specialized cooling hardware either in proximity to or in physical contact with such integrated circuits. The use of bus bars to provide enhanced carrying capacity of electrical power between portions of circuitboards is also known, including bus bars that additionally incorporate dielectric material between conductors to provide filtering of electrical power.

As a result of technological progress, integrated circuits continue to become physically smaller while the number of functions they perform continue to increase. This has resulted in an ever increasing density of electrical connections that must be made between such integrated circuits and the circuitboards to which they are attached in order to support this increasing number of functions. Circuitboards generally make electrical connections between integrated circuits and other components (including other integrated circuits) using traces routed on a plurality of layers. There are often also power and/or ground planes among these layers. To make electrical connections between circuitboards and integrated circuits in through-hole packages (such as DIP or PGA), or where a socket with through-hole pins is used, a plurality of holes are made through the circuitboard to accommodate the pins, and the traces are routed directly to the locations of those holes. In the case of integrated circuits in surface-mount packages (such as QFP or BGA), a plurality of holes are made through the circuitboard to accommodate the creation of vias through the circuitboard at locations adjacent to the surface mount contacts of the integrated circuits, and traces on layers other than the layer existing on the surface of the circuitboard to which the integrated circuit is attached are routed to those vias.

With the increasing density of electrical connections between integrated circuits and circuitboards, the density of these holes made through the circuitboard in the vicinity of where such integrated circuits are attached to a circuitboard is also increasing, and this increase in density of these holes can impede efforts to maintain the continuity of a ground or power plane passing through a region of a circuitboard where these holes exist. The effect can be the reduction of continuity through that region to such a degree that current carrying capacity between regions of a power or ground plane is compromised or undesirable voltage differentials can be allowed to develop in regions of the same power or ground plane on opposite sides of a region where such an integrated circuit has been mounted. A need exists to counteract this loss in continuity in a cost-effective manner.

BRIEF DESCRIPTION OF THE DRAWINGS

The objects, features, and advantages of the present invention will be apparent to one skilled in the art in view of the following detailed description in which.

DETAILED DESCRIPTION

In the following description, for purposes of explanation, numerous details are set forth in order to provide a thorough understanding of the present invention. However, it will be apparent to one skilled in the art that these specific details are not required in order to practice the present invention.

The present invention concerns using retention hardware to both secure an integrated circuit cooling apparatus and to provide an electrical connection between two regions of a circuit board. Specifically, an embodiment of the present invention concerns incorporating bus bars into retention hardware used to mount a fan and heatsink assembly. However, although the present invention is discussed in reference to retention hardware for retaining fan and heatsink assemblies, it is also applicable to retention hardware for retaining other forms of cooling apparatus used to cool an integrated circuit.

Figure 1A:
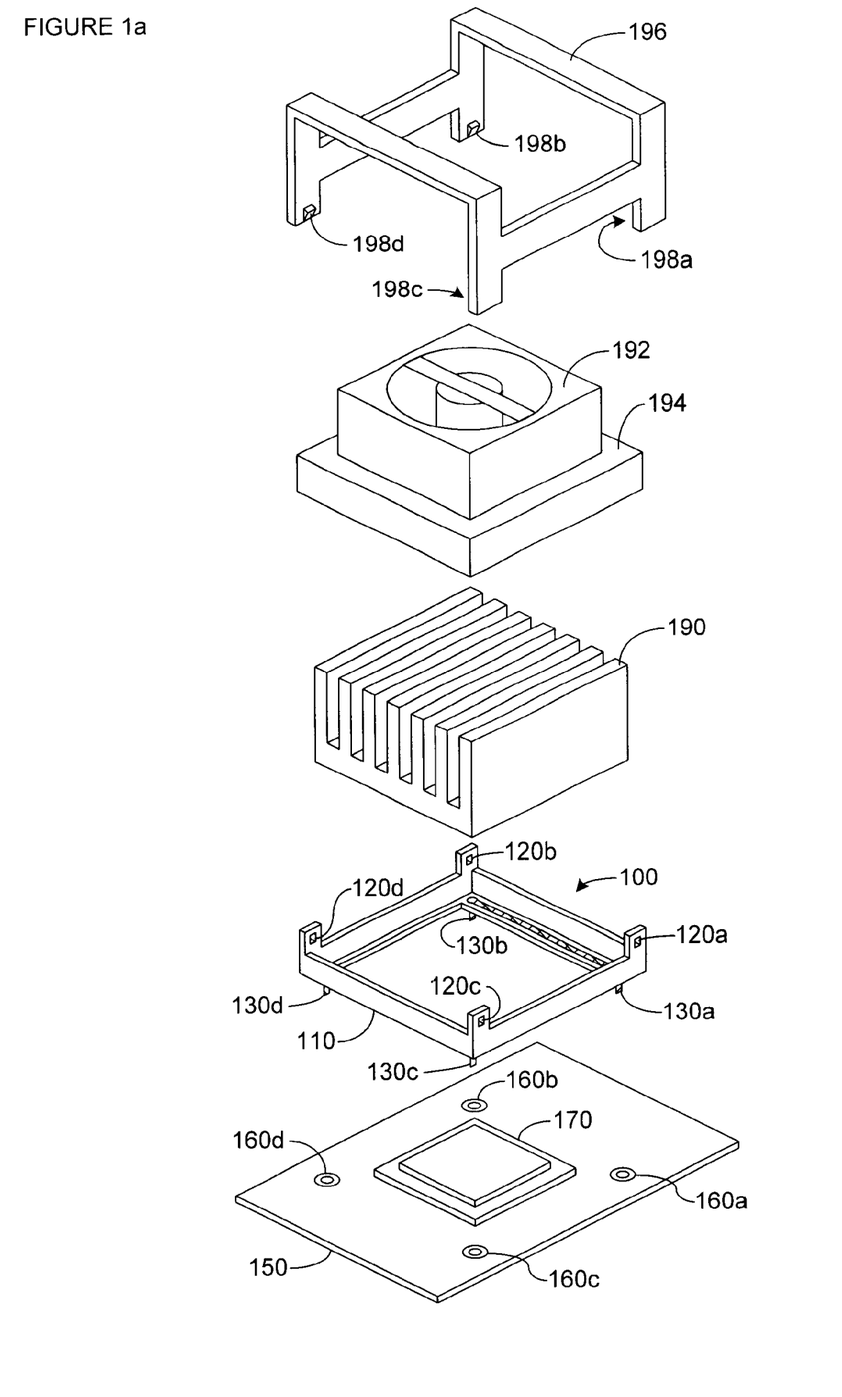
FIG. 1 is an exploded view of one embodiment of the present invention.

FIG. 1a depicts an exploded view of one embodiment of the present invention as it might be assembled with other apparatus for use. Retention module 100 is comprised of frame 110, retention holes 120a–d and through-hole pins 130a–d. Retention module 100 may be used in cooperation with retaining clip 196 to hold the assembly of heatsink 190 and fan 192 together and into physical contact with integrated circuit 170 attached to circuitboard 150. In support of such use, retention clip 196 includes retention stubs 198a–d, of which only retention stubs 198b and 198d are visible due to the perspective view afforded by FIG. 1a. In preparation for such use, through-hole pins 130a–d of retention module 100 are inserted through and soldered to the periphery of through-holes 160a–d, respectively, of circuitboard 150.

To hold the assembly of heatsink 190 and fan 192 together and into physical contact with integrated circuit 170, retention holes 120a–d of frame 130 of retention module 100 engage retention stubs 198a–d of retention clip 196, which in turn, overlie and press against the periphery of shroud 194 of fan 192. Shroud 194 of fan 192, in turn, overlays and presses against heatsink 190 to press heatsink 190 into physical contact with a surface of integrated circuit 170, thereby allowing heat to be conducted from that surface of integrated circuit 170 and into the material of heatsink 190.

Figure 1B:
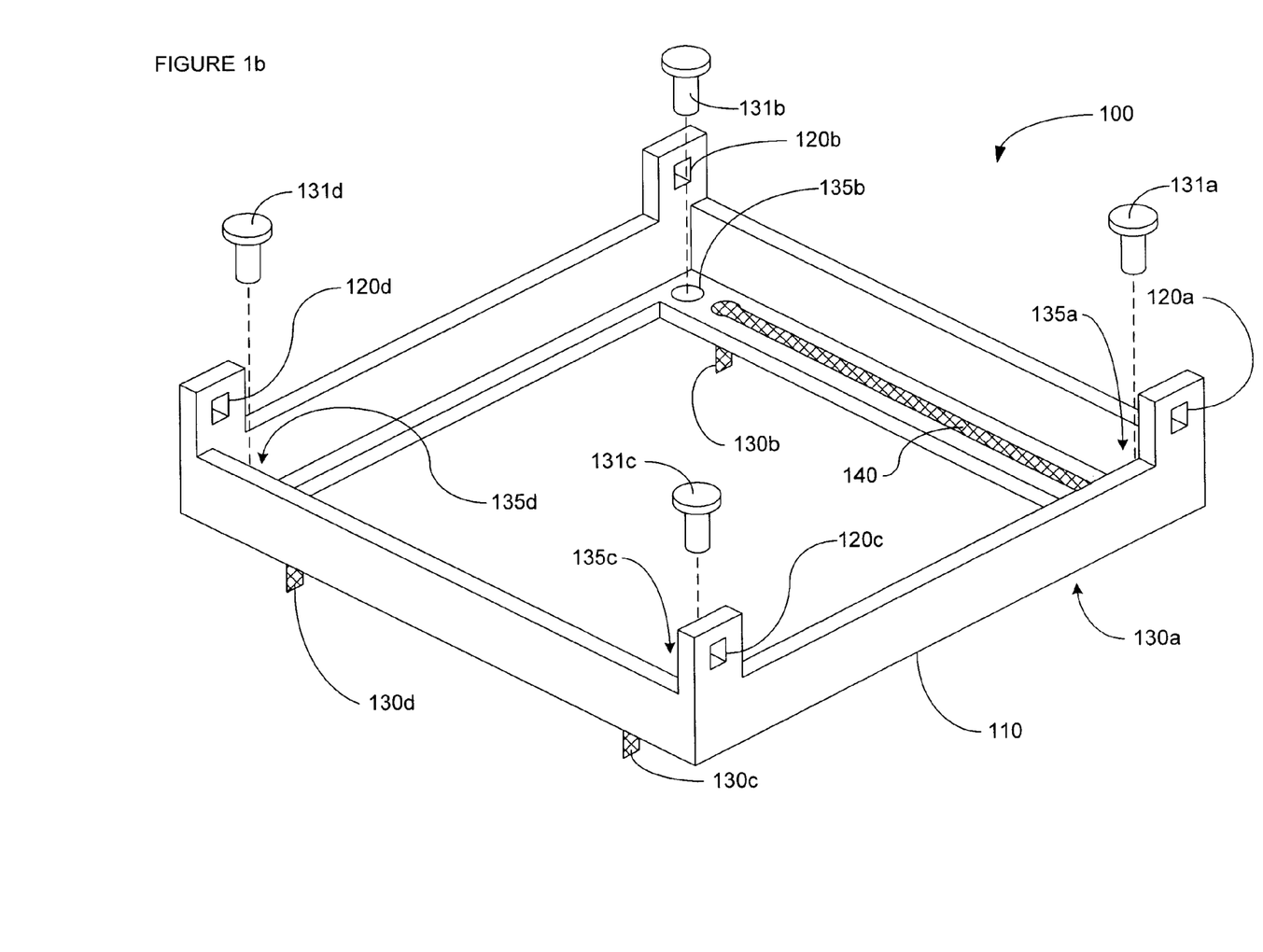

Although FIG. 1a depicts a single through-hole pin (i.e., through-hole pins 130a–d) at each corner of frame 130, it will be understood by those skilled in the art that other quantities and/or configurations of through-hole pins may be used. Specifically, although through-hole pins 130a–d of FIG. 1a are the only through-hole pins shown, and are therefore used to both retain frame 130 of retention module 100 to circuitboard 150 and to make conductive electrical contact with through-holes 160a–d of circuitboard 150, alternate embodiments may incorporate the use of differing through-hole pins, one or more of which may perform only one or the other of these two functions. Retention modulen 100 may rely on screws, rivets, retaining pins with expanding tips or any other form of a variety of known mounting hardware, such as mounting hardware 131a–131d cooperating with mounting holes 135a–135d, respectively, in the variation of frame 100 of FIG. 1a shown in close up in FIG. 1b, to perform the work of retaining frame 130 to circuitboard 150, while other through-hole pins perform the work making electrical connections between bus bars, such as bus bar 140 carried by frame 130, and circuitboard 150. Alternatively, retention module 100 may rely on screws engaging hardware carried by circuitboard 150, retaining pins with expanding tips or any other form of a variety of known hardware, such as mounting hardware 131a–131d, to perform the work of making conductive electrical contact. Furthermore, still other alternative embodiments may incorporate a variety of known hardware to both retain frame 130 to circuitboard 150 and to make conductive electrical contact.

In alternate embodiments, a greater or lesser number of retention holes may be provided by frame 130, or a retaining mechanism other than holes may be provide by frame 130 to engage retention clip 196.

Also, in alternate embodiments, a plurality of bus bars may be placed in parallel along portions of frame 130 to carry both power and ground planes, and/or multiple power planes side-by-side. In such alternate embodiments, dielectric material may be inserted between two or more of such bus bars to thereby create a capacitor therebetween to provide power filtering or for other reasons such as reducing EMI or VLF emissions.

In one embodiment, integrated circuit 170 is attached directly to circuitboard 150. In this embodiment, integrated circuit 170 may be comprised of a through-hole package such as DIP or PGA, or may be comprised of a surface-mount package such as QFP or BGA. In another embodiment, integrated circuit 170 is attached to circuitboard 150 via a socket (not shown) interposed between integrated circuit 170 and circuitboard 150. In this other embodiment, integrated circuit 170 may be comprised of a through-hole package such as DIP or PGA, and the socket interposed between integrated circuit 170 and circuitboard 150 may be a ZIF socket.

Furthermore, in one embodiment, integrated circuit 170 is a processor in a computer system or other digital processing system, and circuitboard 150 is a systemboard that comprises at least a portion of a computer system or other digital processing system. In another embodiment, integrated circuit 170 is a support circuit that provides an interface between a processor and other logic, or a bridge between two or more busses within a computer system or other digital processing system. In still another embodiment, integrated circuit 170 is a graphics controller serving as a component of a graphics system, and circuitboard 150 is either a systemboard comprising part of a computer system or a graphics card meant to be installed within a computer system.

Figure 2:
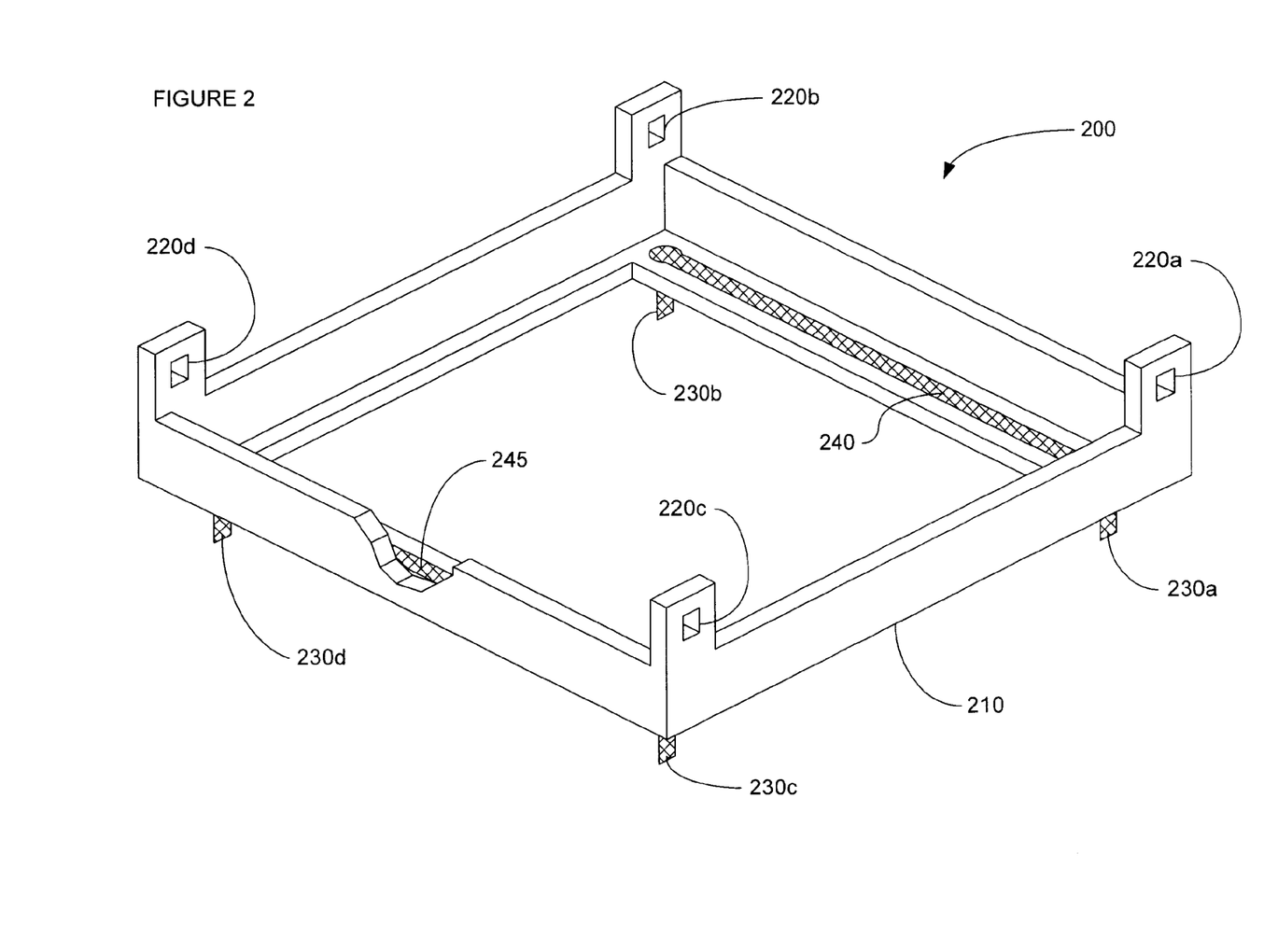
FIG. 2 is a perspective view of the embodiment depicted in FIG. 1 with a portion broken away to reveal more detail.

FIG. 2 depicts a perspective view of the embodiment of the present invention that was depicted as part of the exploded view of FIG. 1 with a portion broken away to reveal more detail. In a manner corresponding to retention module 100 of FIG. 1, retention module 200 is comprised of frame 210, retention holes 220a–d and through-hole pins 230a–d. Shown more clearly in FIG. 2, however, is that retention module 200 is also comprised of bus bars 240 and 245, making an electrical connection between through-hole pins 230a and 230b, and between through-hole pins 230c and 230d, respectively. Part of frame 210 has been broken away between the vicinities of retention holes 220c and 220d to reveal bus bar 245.

Although retention module 200 is depicted as having only a pair of bus bars, each on opposite sides of frame 210, it will be understood by those skilled in the art that varying numbers of bus bars oriented in various directions relative to each other may be carried by frame 210. Specifically, multiple parallel bus bars may be carried along one side of frame 210. Also, bus bars carried within frame 210 need not be limited to conducting electricity from one corner of frame 210 to another adjacent corner, but could conduct electricity from any one portion of frame 210 at which a connection is made to a circuitboard to which retention module 200 is attached to any other such portion of frame 210. Also, one or more bus bars may form a closed loop within frame 210, possibly making electrical contact at all four corners of frame 210. Two or more of such closed loop bus bars may be carried within frame 210 in close proximity with each other and with dielectric material therebetween to form a capacitor between two or more of such bus bars. Furthermore, although bus bars 240 and 245 are depicted as having a substantially planar shape and oriented in a manner that cause bus bars 240 and 245 to be substantially parallel with a circuitboard to which retention module 200 may be attached, it will be understood by those skilled in the art that bus bars carried within retention module 200 may be of any conceivable shape and/or orientation.

Figure 3:
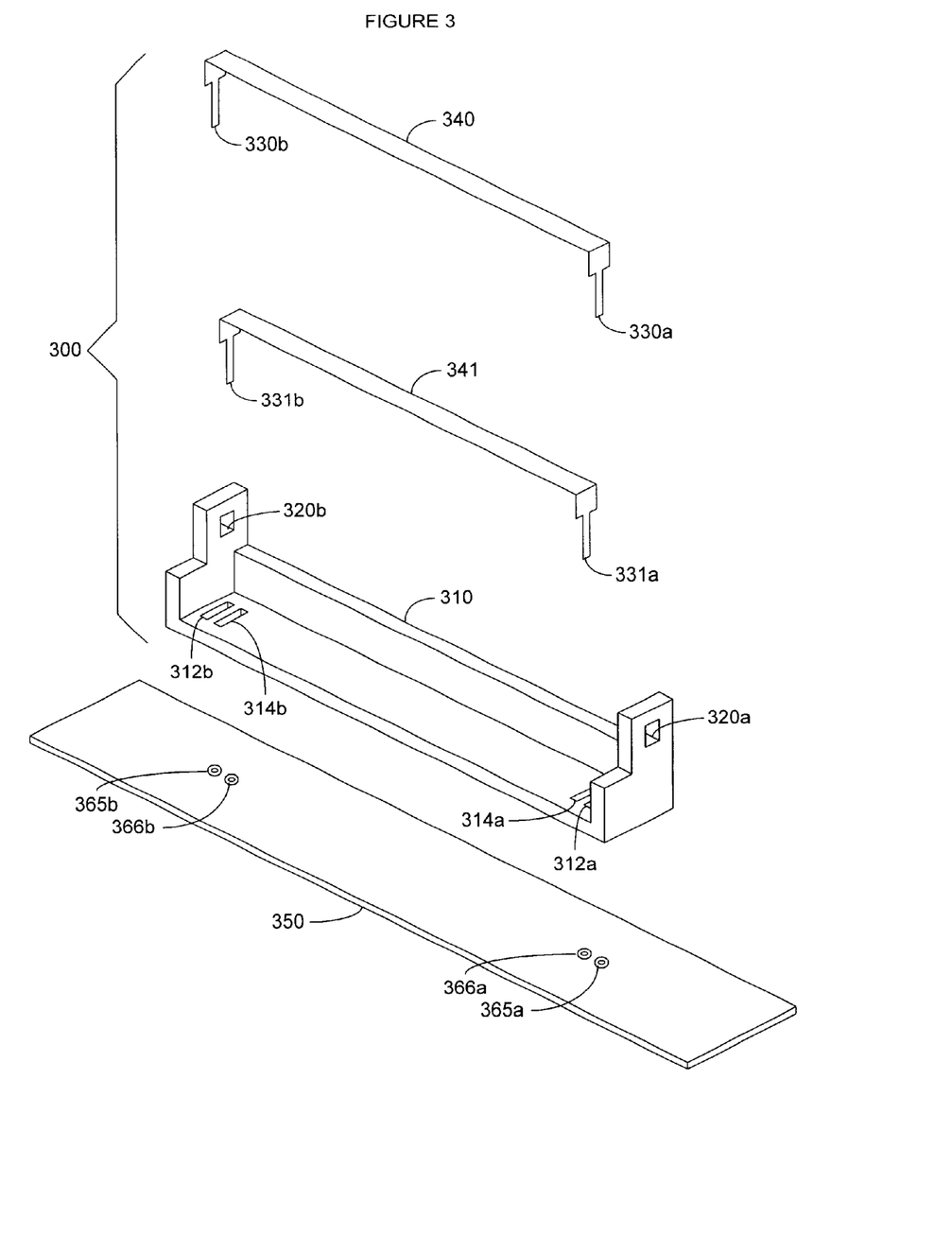
FIG. 3 is a perspective view of another embodiment of the present invention.

FIG. 3 depicts an exploded perspective view of an alternate embodiment of the present invention. Retention module 300 is comprised of frame 310 with retention holes 320a–b, and bus bars 340 and 341. Bus bar 340 is electrically connected to through-hole pins 330a and 330b, and bus bar 341 is electrically connected to through-hole pins 331a and 331b. Holes 312a and 312b formed through frame 310 allow through-hole pins 330a and 330b of bus bar 340 to pass through frame 310, and into through-holes 365a and 365b, respectively, of circuitboard 350. Similarly, holes 314a and 314b formed through frame 310 allow through-hole pins 331a and 331b of bus bar 341 to pass through frame 310, and into through-holes 366a and 366b, respectively, of circuitboard 350.

Bus bars 340 and 341 are shown in a configuration in FIG. 3 that would result in their substantially overlapping each other, their respective through-hole pins being inserted through the corresponding holes of frame 310. In this embodiment, an insulator (not shown) may be interposed between bus bars 340 and 341 to electrically isolate them. Alternatively, dielectric material may be inserted between bus bars 340 and 341 to form a capacitor therebetween to provide power filtering and/or to perform other functions such as reducing EMI or VLF emissions. Despite bus bars 340 and 341 being depicted as overlapping each other, it will be understood by those skilled in the art that pluralities of bus bars may be disposed about frame 310 in any of a variety of orientations or positions relative to each other.

In using the embodiment of the present invention depicted in FIG. 3 to retain a heatsink and fan together and in physical contact with an integrated circuit, a pair of retaining modules 300 would be used, with retention holes 320a and 320b of each of the pair of retaining modules 300 providing four retention holes that could be engaged by hardware such as retention clip 196 of FIG. 1.

Figures 4A, 4B, 4C, 4D:
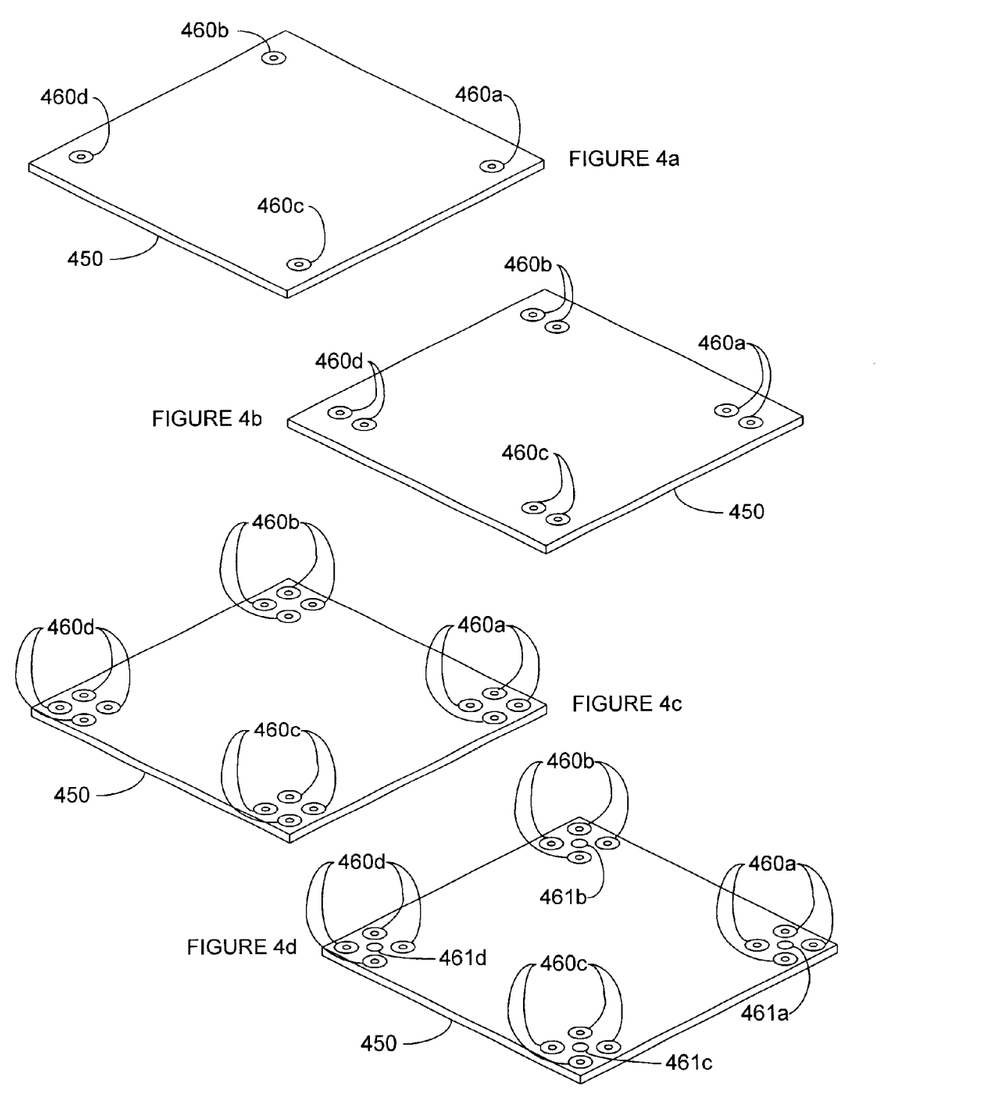
FIGS. 4a–d are perspective views of various patterns of through-holes for various embodiments of the present invention.

FIGS. 4a–d depicts patterns of through-holes corresponding to various possible embodiments of the present invention. Each of FIGS. 4a–d depict through-holes 460a, 460b, 460c and 460d laid out on circuitboard 450 in a manner that is meant to be illustrative for purposes of facilitating clarity in describing embodiments the present invention, and should therefore not be construed as necessarily having been drawn to scale. FIG. 4a depicts a pattern of through-holes 460a–d consistent with the embodiment depicted in FIGS. 1 and 2. FIG. 4b depicts a pattern of through-holes 460a–d consistent with the embodiment depicted in FIG. 3 wherein a pair of bus bars could be used to conduct ground and/or various voltages between adjacent corners. FIG. 4c depicts a pattern of through-holes 460a–d consistent with another embodiment of the present invention likely to have multiple bus bars conducting ground and/or various voltages between adjacent corners, or distributing ground and/or various voltages among all four corners. FIG. 4d depicts a pattern of through-holes 460a–d, that like those of FIG. 4c, are consistent with still another embodiment of the likely to have multiple bus bars conducting ground and/or various voltages between adjacent corners or among all four corners. The embodiments of the present invention that correspond to either of FIG. 4c or 4d may have frames similar in configuration to either of frames 210 or 310 of the embodiments of either FIG. 2 or 3, respectively. Furthermore, as those skilled in the art will recognize, the through-holes depicted in the patterns of FIGS. 4a–d and/or other patterns may all be through-plated such that the entire surface of the hole bridging the two sides of a circuitboard is plated with conductive material. Alternatively, some of the through-holes, such as through-holes 461a, 461b, 461c and 461d, of a given pattern may not be through-plated, and may be formed through a circuitboard, such as circuitboard 450 of FIG. 4d, only for purposes of providing a means of attaching the frame of an embodiment of the present invention to a circuitboard.

Figure 5:
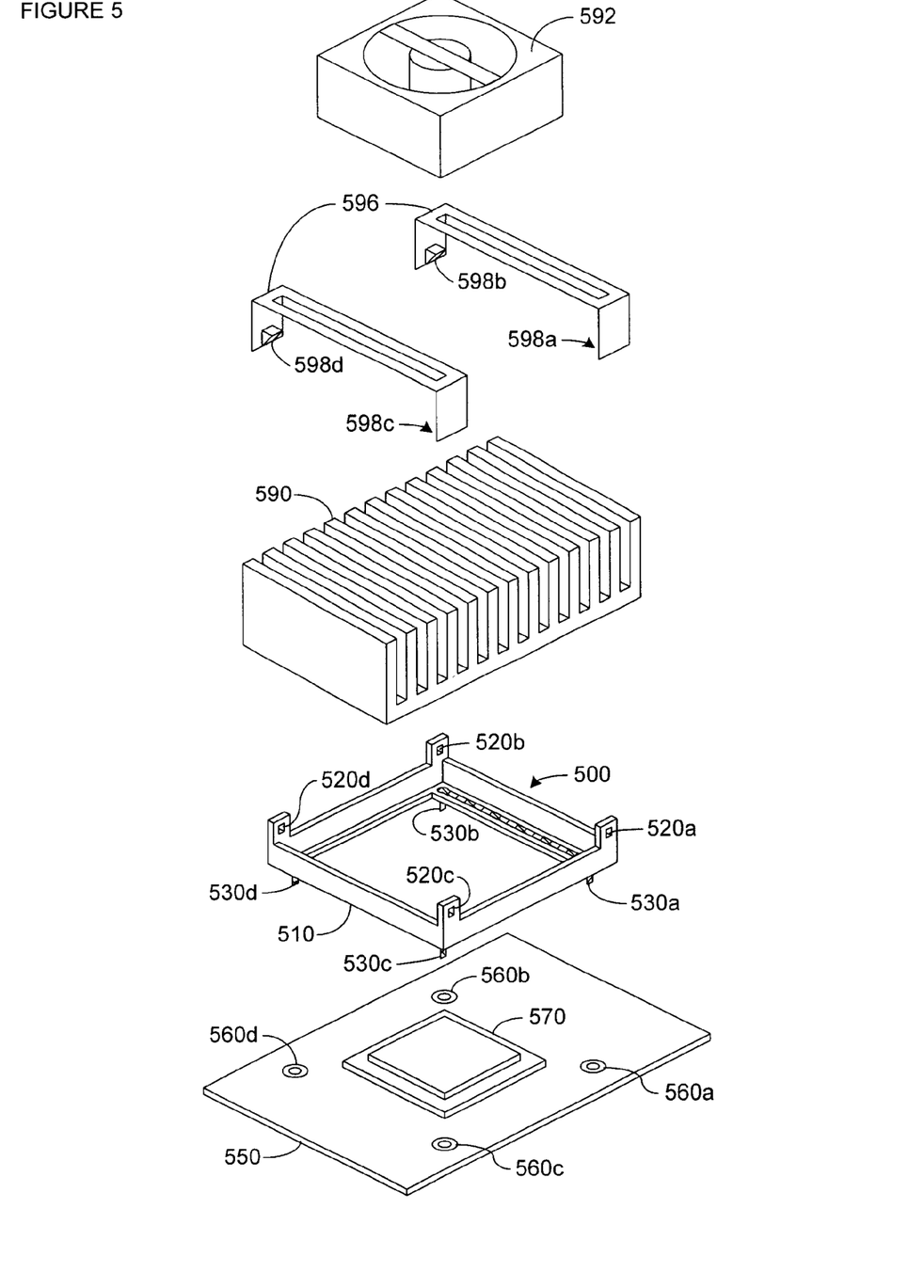
FIG. 5 is an exploded view of yet another embodiment of the present invention.

FIG. 5 depicts an exploded view of yet another embodiment of the present invention as it might be assembled with other apparatus for use. Retention module 500 is comprised of frame 510, retention holes 520a–d and through-hole pins 530a–d. Retention module 500 may be used in cooperation with retaining clips 596 to hold the assembly of heatsink 590 and fan 592 into physical contact with integrated circuit 570 attached to circuitboard 550. In support of such use, retention clips 596 include retention stubs 598a–d, of which only retention stubs 598b and 598d are visible due to the perspective view afforded by FIG. 5. In preparation for such use, through-hole pins 530a–d of retention module 500 are inserted through and soldered to the periphery of through-holes 560a–d, respectively, of circuitboard 550.

In one embodiment, the assembly of heatsink 590 and fan 592 is held in direct physical contact with integrated circuit 570. In another embodiment, thermally conductive material such as heatsink grease, thermal grease, thermal tape, etc., is interposed between integrated circuit 570 and the assembly of heatsink 590 and fan 592. In yet another embodiment, a thermoelectric cooler module is interposed between integrated circuit 570 and the assembly of heatsink 590 and fan 592. In still another embodiment, a cooling apparatus other than the assembly of heatsink 590 and fan 592 is held adjacent to integrated circuit at least in part by frame 510.

In one embodiment, integrated circuit 570 is attached directly to circuitboard 550. In this embodiment, integrated circuit 570 may be comprised of a through-hole package such as DIP or PGA, or may be comprised of a surface-mount package such as QFP or BGA. In another embodiment, integrated circuit 570 is attached to circuitboard 550 via a socket (not shown) interposed between integrated circuit 570 and circuitboard 550. In this other embodiment, integrated circuit 570 may be comprised of a through-hole package such as DIP or PGA, and the socket interposed between integrated circuit 570 and circuitboard 550 may be a ZIF socket.

Furthermore, in one embodiment, integrated circuit 570 is a processor in a computer system or other digital processing system, and circuitboard 550 is a systemboard that comprises at least a portion of a computer system or other digital processing system. In another embodiment, integrated circuit 570 is a support circuit that provides an interface between a processor and other logic, or a bridge between two or more busses within a computer system or other digital processing system. In still another embodiment, integrated circuit 570 is a graphics controller serving as a component of a graphics system, and circuitboard 550 is either a systemboard comprising part of a computer system or a graphics card meant to be installed within a computer system.

The invention has been described in conjunction with the preferred embodiment. It is evident that numerous alternatives, modifications, variations and uses will be apparent to those skilled in the art in light of the foregoing description. It will be understood by those skilled in the art that the present invention may be practiced in support of the cooling of various microelectronic or micromechanical devices including, but not limited to, integrated circuits of the type commonly found in digital computer systems. It will also be understood that the present invention may be practiced in support of cooling by any apparatus meant to be held either in physical contact with or in a fixed location adjacent to the device to be cooled including, but not limited to, heatsinks, fans, thermoelectric cooler modules, liquid-based heat pipes, airflow ducting, and/or various combinations of these. Specifically, although the invention has been depicted with fan and heatsink assemblies that are generally rectangular in shape with the fan attached to the periphery of the heatsink, it will be understood by those skilled in the art that fan and heatsink assemblies of various shapes and/or configurations may be used. Finally, although the present invention has been depicted with separate retention modules and retaining clips, it will be appreciated that these may be formed together as a single integrated piece mounted to a circuitboard.

The example embodiments of the present invention are described in the context of the cooling of microelectronic devices. However, the present invention is applicable to other forms of circuitry mounted within a larger device in a variety of ways including, but not limited to, mounted via a socket and/or directly to the die, substrate or packaging of another form of circuitry.

What is claimed is:

1. An apparatus, comprising:
   a frame for retaining a cooling apparatus in engagement with a surface of an integrated circuit that is attached to a circuitboard, the frame also being attached to the circuitboard at least at a first location and a second location about the periphery of the integrated circuit; and
   a first bus bar disposed about the frame carrying an electrical signal from the first location of the circuitboard to the second location of the circuitboard.

2. The apparatus of claim 1, wherein the frame is shaped to be positioned about the periphery of the integrated circuit attached to the circuitboard.

3. The apparatus of claim 2, wherein the frame is in the shape of a polygonal ring that surrounds the periphery of the integrated circuit, the first location of the circuitboard is adjacent to a first corner of the frame, and the second location of the circuitboard is adjacent to a second corner of the frame.

4. The apparatus of claim 1, wherein a second bus bar is disposed about the frame in close proximity to and substantially parallel with the first bus bar such that dielectric material may be interposed between the first and second bus bars to form a capacitor.

5. The apparatus of claim 1, wherein the frame is substantially elongate in shape, having a first end and a second end, and wherein the first location of the circuitboard is adjacent to the first end, and the second location of circuitboard is adjacent to the second end.

6. The apparatus of claim 1, wherein the first bus bar is substantially elongate in shape, having a first end and a second end, from which a first through-hole pin and a second through-hole pin emanate, respectively, and wherein the first and second through-hole pins extend through first and second conductive holes formed through the circuitboard at the first and second locations, respectively, when the frame is attached to the circuitboard.

7. The apparatus of claim 6, further comprising mounting hardware to make contact between the frame and the circuitboard, independent of the first and second through-hole pins, to retain the frame to the circuitboard.

8. A method, comprising:
attaching an integrated circuit to a circuitboard;
disposing a first bus bar about a frame for retaining a cooling apparatus in engagement with a surface of the integrated circuit; and
attaching the frame to the circuitboard at least at a first location and a second location on the circuitboard about the periphery of the integrated circuit to cause the bus bar to carry an electrical signal from the first location of the circuitboard to the second location of the circuitboard.

9. The method of claim 8, wherein the frame is shaped to be positioned about the periphery of an integrated circuit attached to the circuitboard.

10. The method of claim 8, wherein the first bus bar carries an electrical signal from a first region of a voltage plane of the circuitboard that encompasses the first location to a second region of the voltage plane of the circuitboard that encompasses the second location.

11. The method of claim 8, wherein the integrated circuit is attached to the circuitboard at a location between the first and second locations of the circuitboard.

12. The method of claim 8, wherein attaching the frame to the circuitboard comprises extending through-hole pins emanating from the first bus bar through holes formed in the circuitboard at the first and second locations, respectively.

13. The method of claim 12, wherein the through-hole pins emanating from the bus bar engage the circuitboard with sufficient strength to retain the frame to the surface of the circuitboard and to aid in retaining the cooling apparatus in engagement with the integrated circuit.

14. The method of claim 8, wherein attaching the frame to the circuitboard comprises extending a portion of mounting hardware carried by the frame through a hole formed in the circuitboard.

15. An apparatus, comprising:
a frame for retaining a cooling apparatus in a predetermined position relative to an integrated circuit that is attached to a circuitboard at least at a first location and a second location about the periphery of the integrated circuit; and
a first bus bar disposed about the frame carrying an electrical signal from the first location of the circuitboard to the second location of the circuitboard.

16. The apparatus of claim 15 wherein the integrated circuit is attached to the circuitboard by way of a socket attached to the circuitboard.

17. The apparatus of claim 15, wherein the frame is shaped to be positioned about the periphery of the integrated circuit attached to the circuitboard.

18. The apparatus of claim 18, wherein the frame is in the shape of a polygonal ring that surrounds the periphery of the integrated circuit, the first location of the circuitboard is adjacent to a first corner of the frame, and the second location of the circuitboard is adjacent to a second corner of the frame.

19. The apparatus of claim 15 wherein the frame is substantially elongate in shape, having a first end and a second end.

20. The apparatus of claim 19 wherein the first and second locations of the circuitboard are adjacent to the first and second ends of the frame, respectively.

21. The apparatus of claim 19 wherein the frame is one of a plurality of frames of elongate shape cooperating to retain the cooling apparatus in a predetermined location relative to the integrated circuit.

22. The apparatus of claim 15, wherein a second bus bar is disposed about the frame in close proximity to and substantially parallel to the first bus bar such that dielectric material may be interposed between the first and second bus bars to form a capacitor.

23. An computer system, comprising:
a circuitboard to which an integrated circuit is attached;
a frame attached to the circuitboard at least at a first location and a second location about the periphery of the integrated circuit for retaining a cooling apparatus in a predetermined position relative to the integrated circuit; and
a first bus bar disposed about the frame carrying an electrical signal from the first location of the circuitboard to the second location of the circuitboard.

24. The computer system of claim 23 wherein the integrated circuit is attached to the circuitboard by way of a socket attached to the circuitboard.

25. The computer system of claim 23, wherein the frame is shaped to be positioned about the periphery of the integrated circuit attached to the circuitboard.

26. The computer system of claim 25, wherein the frame is in the shape of a polygonal ring that surrounds the periphery of the integrated circuit, the first location of the circuitboard is adjacent to a first corner of the frame, and the second location of the circuitboard is adjacent to a second corner of the frame.

27. The computer system of claim 23 wherein the frame is substantially elongate in shape, having a first end and a second end, and wherein the first and second locations of the circuitboard are adjacent to the first and second ends of the frame, respectively.

28. The computer system of claim 23, wherein a second bus bar is disposed about the frame in close proximity to and substantially parallel to the first bus bar such that dielectric material may be interposed between the first and second bus bars to form a capacitor.

29. The computer system of claim 23, wherein the integrated circuit is a processor of the computer system.

* * * * *

UNITED STATES PATENT AND TRADEMARK OFFICE
CERTIFICATE OF CORRECTION

PATENT NO. : 6,606,246 B2
DATED : August 12, 2003
INVENTOR(S) : Wells

It is certified that error appears in the above-identified patent and that said Letters Patent is hereby corrected as shown below:

Column 2,
Line 64, delete "modulen" and insert -- module --.

Signed and Sealed this

Twenty-fifth Day of November, 2003

JAMES E. ROGAN
*Director of the United States Patent and Trademark Office*